US005579247A

United States Patent [19]
Kerth et al.

[11] Patent Number: 5,579,247
[45] Date of Patent: Nov. 26, 1996

[54] METHOD AND APPARATUS FOR DECREASING THE INTERFERENCE AND NOISE SENSITIVITY OF A RATIOMETRIC CONVERTER TYPE OF CIRCUIT

[75] Inventors: Donald A. Kerth; Navdeep S. Sooch, both of Austin, Tex.

[73] Assignee: Crystal Semiconductor Corporation, Austin, Tex.

[21] Appl. No.: 537,224

[22] Filed: Sep. 29, 1995

Related U.S. Application Data

[63] Continuation of Ser. No. 441,672, May 15, 1995, abandoned, which is a continuation of Ser. No. 197,666, Feb. 14, 1994, abandoned, which is a continuation of Ser. No. 656,294, Feb. 15, 1991, abandoned.

[51] Int. Cl.$^6$ .................................................. G06F 19/00
[52] U.S. Cl. ..................... 364/571.02; 324/608; 341/143
[58] Field of Search .............................. 364/550, 571.01, 364/571.02, 571.05, 570, 572, 574; 324/607, 608; 341/116, 118, 119, 120, 122, 132, 138, 139, 143, 144, 166, 167

[56] References Cited

U.S. PATENT DOCUMENTS

| | | | |
|---|---|---|---|
| 4,104,725 | 8/1978 | Rose et al. | 364/487 |
| 4,507,740 | 3/1985 | Star et al. | 364/487 |
| 4,624,331 | 11/1986 | Naito | 177/185 |
| 4,639,885 | 1/1987 | Spock et al. | 364/572 X |
| 4,658,367 | 4/1987 | Potter | 364/572 X |
| 4,746,899 | 5/1988 | Swanson et al. | 341/122 |
| 4,751,973 | 6/1988 | Freeman et al. | 177/25 |
| 4,785,419 | 11/1988 | Huffman | 364/571.01 |
| 4,802,098 | 1/1989 | Hansen et al. | 364/572 X |
| 4,841,227 | 6/1989 | Maier | 324/608 X |
| 4,943,807 | 6/1990 | Early et al. | 341/120 |
| 5,028,874 | 7/1991 | Parle | 324/608 |
| 5,065,351 | 11/1991 | Johnston et al. | 364/570 X |
| 5,079,550 | 1/1992 | Sooch et al. | 341/118 X |
| 5,087,914 | 2/1992 | Sooch et al. | 341/118 X |
| 5,117,929 | 6/1992 | Nakamura et al. | 177/185 |

FOREIGN PATENT DOCUMENTS

| | | |
|---|---|---|
| 0103747 | 3/1984 | European Pat. Off. . |
| 0122796 | 10/1984 | European Pat. Off. . |
| 0129249 | 12/1984 | European Pat. Off. . |
| 0147238 | 7/1985 | European Pat. Off. . |
| 0430695A2 | 6/1991 | European Pat. Off. . |
| 0430695 | 6/1991 | European Pat. Off. . |
| 59-033927 | 2/1984 | Japan . |
| 60-039521 | 3/1985 | Japan . |
| 60-072417 | 4/1985 | Japan . |
| 60-145730 | 8/1985 | Japan . |
| 1-250731 | 10/1989 | Japan . |
| 2-189466 | 7/1990 | Japan . |
| 2-253130 | 10/1990 | Japan . |
| 3-025316 | 2/1991 | Japan . |
| 3-064216 | 3/1991 | Japan . |

OTHER PUBLICATIONS

Analog Devices' Data Book, 5th edition, (in Japanese) pp. 12–4, Jun. 1990.
Company Magazine: Analog Devices, LC–MOS–Signal Conditioning ADC, AD 7710 (No Date).
German periodical: Elektronik 1/ 5. Jan. 1990, pp. 74 to 79.

*Primary Examiner*—James P. Trammell
*Assistant Examiner*—Edward Pipala
*Attorney, Agent, or Firm*—Robert D. Lott

[57] ABSTRACT

A ratiometric converter receives an external sense signal and external reference signal and provides an output signal which is proportional to the sense signal and inversely proportional to the reference signal. Electromagnetic interference and noise coupled onto the sense and reference lines are effectively removed by converting the sense signal to a digital signal and converting the reference signal to a digital signal. The digital sense signal is then filtered through a low pass filter to provide a filtered signal, and similarly, the digital reference signal is filtered through a low pass filter to provide a filtered digital reference signal. A divider circuit then divides the filter digital sense signal by the filter digital reference signal to provide the output signal.

17 Claims, 5 Drawing Sheets

METHOD AND APPARATUS FOR DECREASING THE INTERFERENCE AND NOISE SENSITIVITY OF A RATIOMETRIC CONVERTER TYPE OF CIRCUIT

This is a continuation of application Ser. No. 08/441,672, filed on May 15 1995, abandoned which is a continuation of application Ser. No. 08/197,666, filed on Feb. 14, 1994, and now abandoned, which is a continuation of application Ser. No. 07/656,294, filed on Feb. 15, 1991, and now abandoned.

TECHNICAL FIELD

The present application pertains to ratiometric converter types of circuits and, more particularly, to methods and apparatus for decreasing the interference and noise sensitivities of ratiometric converter types of circuits.

BACKGROUND OF THE INVENTION

Ratiometric converter types of circuits receive as inputs a sense signal and a reference signal and provide an output signal which is proportional to the sense signal and inversely proportional to the reference signal. Ratiometric converters are used primarily in conjunction with ratiometric DC measurement systems. These DC measurement systems are often Wheatstone bridge circuits in which one of the resistive elements in the bridge is a transducer, such as for example a strain gauge. Such Wheatstone bridge ratiometric measurement systems are also used to measure weight, pressure, temperature, and other mechanical parameters. The system is energized by placing a DC voltage across the bridge, and the DC voltage across the bridge provides a differential reference voltage to the ratiometric converter. The voltage generated across the other two nodes of the bridge forms a differential sense voltage to the ratiometric converter. The ratiometric converter then provides an output signal which is proportional to the differential sense signal and inversely proportional to the differential reference voltage.

In most systems, the transducer is located some distance from the ratiometric converter, and in some cases over 100 meters. Any interference pickup such as power line interference, RF interference, and other types of electromagnetic noise, will corrupt the DC measurement.

In the past shields (such as coaxial cables), twisted wire pairs, and/or analog filters have been used to reduce this interference. While these procedures have been effective for most prior art systems, as higher accuracy systems are evolving (e.g. 16-bit digital systems) a better method of reducing or removing the electromagnetic interference and noise is required.

SUMMARY OF THE INVENTION

It is, therefore, an object of this invention to provide a method and apparatus for decreasing the electromagnetic interference and noise sensitivity in a ratiometric converter.

Shown in an illustrated embodiment of the invention is a method for converting a sense signal and a reference signal to an output signal, the output signal being proportional to the sense signal and inversely proportional to the reference signal. The method includes converting the sense signal to a digital sense signal and converting the reference signal to a digital reference signal. The digital sense signal is filtered to provide a filtered digital sense signal, and the digital reference signal is also filtered to provide a filtered digital reference signal. The filtered digital sense signal is then divided by the filtered digital reference signal to provide the output signal.

Also shown in an illustrated embodiment of the invention is a converter which receives an input sense signal and an input reference signal and which provides an output signal proportional to the input sense signal and inversely proportional to the input reference signal. The converter includes at least one analog-to-digital converter for receiving the input sense signal and converting the input sense signal to a digital sense signal, and for receiving the input reference signal and converting the input reference signal to a digital reference signal. At least one low pass filter is coupled to at least one analog-to-digital converter for filtering the digital sense signal to provide a filtered digital sense signal, and for filtering the digital reference signal to provide a filtered digital reference signal. A divider circuit divides the filtered digital sense signal by the filtered digital reference signal to provide the output signal.

BRIEF DESCRIPTION OF THE DRAWINGS

The aforementioned and other features, characteristics, advantages, and the invention in general will be better understood from the following, more detailed description taken in conjunction with the accompanying drawings in which.

Figure 7:
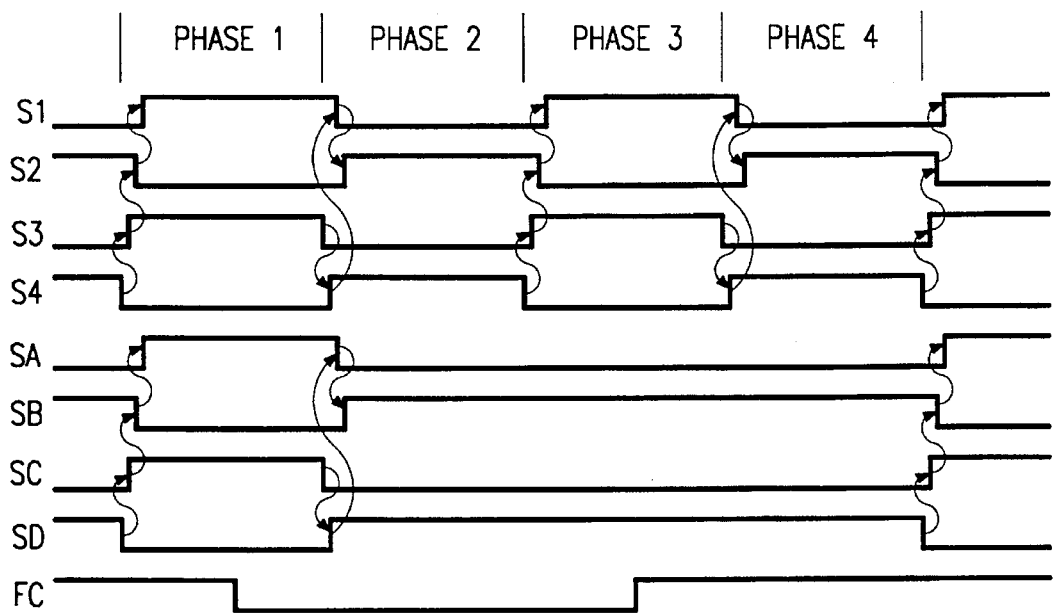
FIG. 7 is a timing diagram of the switches shown in FIG. 6a and 6b.

It will be appreciated that for purposes of clarity and where deemed appropriate, reference numerals have been repeated in the figures to indicate corresponding features, and that the timing signals shown in FIG. 7 have not necessarily been drawn to scale in order to more clearly show timing relationships in the preferred embodiment of the present invention.

DESCRIPTION OF THE PREFERRED EMBODIMENT

A ratiometric converter type of circuit according to the preferred embodiment of the present invention comprises a first delta-sigma modulator and a second delta-sigma modulator. The external sense signal is converted by the first delta-sigma modulator to a digital sense signal using a reference signal generated inside the ratiometric converter.

The external reference signal is converted to a digital reference signal by the second delta-sigma modulator using the same internal reference signal as the first delta-sigma modulator. The output from the first delta-sigma modulator and the second delta-sigma modulator are low pass filtered through a time multiplexed digital filter to provide a filtered digital sense signal and a filtered digital reference signal. A digital divider circuit then divides the filtered digital sense signal by the filtered digital reference signal to provide an output signal which is proportional to the external sense signal and inversely proportional to the external reference signal.

In prior art systems in which the sense signal is divided by the reference signal directly to provide the output signal, any interference coupled into the sense signal and the reference signal will produce a DC error in the output signal. This can be shown mathematically by representing the sense signal as the sum of a constant plus a sinusoidal signal:

$$V_{SEN} = V_S + b \cos(2\pi 60 t) \tag{1}$$

and the reference signal as second constant plus the same sinusoidal signal:

$$V_{REF} = V_R + b \cos(2\pi 60 t) \tag{2}$$

The prior art ratiometric conversion will produce a DC output signal, COUT, of:

$$COUT = \frac{V_{SEN}}{V_{REF}} = 1 + \frac{V_S - V_R}{\sqrt{V_R^2 - b^2}} \tag{3}$$

The DC error will therefore be:

$$DC\ ERROR = 1 + \frac{V_S - V_R}{\sqrt{V_R^2 - b^2}} - \frac{V_S}{V_R} \tag{4}$$

Similarly it can also be shown that there is a DC error produced when the interference is coupled onto the reference signal only. However when the conversion is accomplished using the present invention, the sensitivity of the ratiometric converter to interference pickup, RF interference, and other types of electromagnetic noise is virtually eliminated because the external sense signal and the external reference signal are converted separately to digital signals and then separately filtered before the division operation. Stated another way, there are no intermodulation sources in the analog-to-digital conversion since the internal reference signal is not corrupted by the interference coupled onto the sense and external reference lines.

Figure 1:
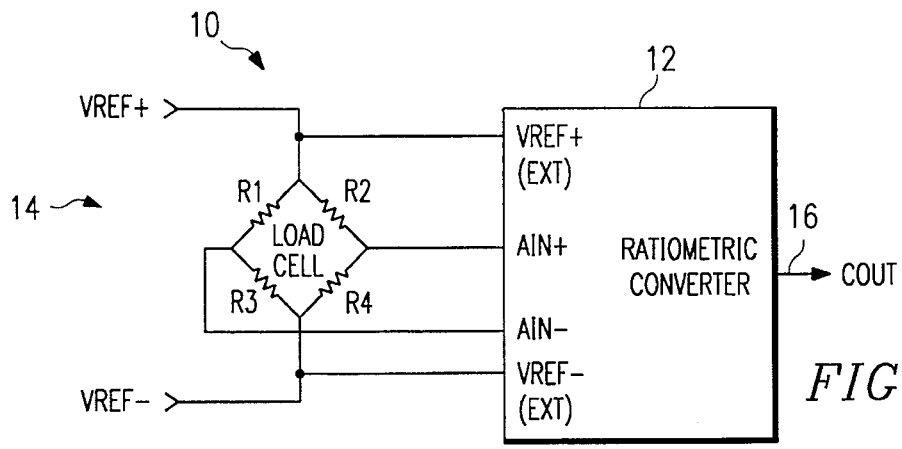
FIG. 1 is a block diagram of a ratiometric system which includes a ratiometric converter according to the present invention.

Turning now to the drawings, FIG. 1 is a block diagram of a ratiometric system 10 which includes a ratiometric converter 12 according to the present invention. The ratiometric system 10 includes a load cell 14 which is shown as a Wheatstone bridge having four resistors R1, R2, R3, and R4. The load cell 14 is energized by the application of a DC voltage of VREF+ and VREF− across the load cell. VREF+ and VREF− are also coupled as two inputs to the ratiometric converter 12 shown as VREF+(EXT) and VREF−(EXT) respectively. A differential sense voltage is generated from the two internal nodes of the load cell 14 and are connected to the inputs to the ratiometric converter 12 shown as AIN+ and AIN−. The ratiometric converter 12 provides an output signal COUT which is proportional to the differential sense voltage appearing at inputs AIN+ and AIN− and inversely proportional to the input reference signals appearing at VREF+(EXT) and VREF−(EXT).

Figure 2:
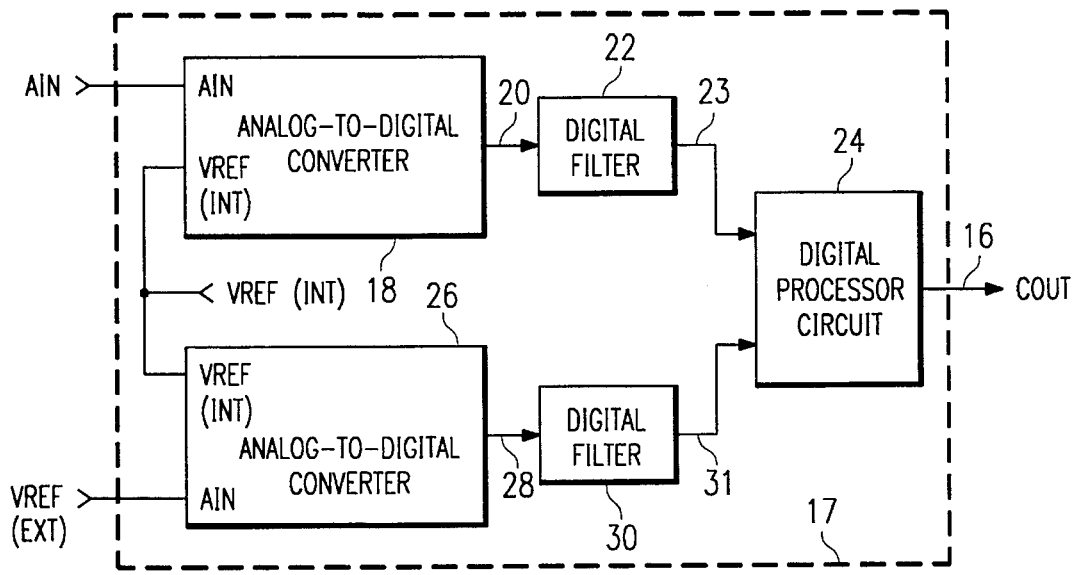
FIG. 2 is a block diagram of a ratiometric converter type of circuit according to the present invention.

FIG. 2 is a block diagram of a ratiometric converter type of circuit 17 which is used for the ratiometric circuit 12 shown in FIG. 1. The ratiometric converter type of circuit 17 contains a first analog-to-digital converter 18 which has an input connected to the input sense signal AIN. It will be understood that while the input signal AIN is shown as a single-ended input, it represents the differential signal AIN+ and AIN− shown in FIG. 1. Also shown as an input to the analog-to-digital converter 18 is an internal reference signal VREF(int). The output of the first analog-to-digital converter 18 on line 20 is connected to the input of a first digital filter 22. The output of the first digital filter 22 is connected to one input of a digital processor circuit 24 and the output of the digital processor circuit 24 forms the output COUT on line 16.

Also shown in FIG. 2 is a second analog-to-digital converter 26 which receives as an input VREF(EXT). It will be understood that while the input signal VREF(EXT) is shown as a single ended input, it represents the differential signals VREF+(EXT) and VREF−(EXT) shown in FIG. 1. The analog-to-digital converter 26 also has a second input of VREF(INT). The output of the second analog-to-digital converter 26 on line 28 is connected to the input of a second digital filter 30. The output of the digital filter 30 forms a second input to the digital processor circuit 24.

In operation, the sense input signal AIN is converted to a digital signal in the analog-to-digital converter 18. The conversion is based on the internal reference voltage VREF(INT). The digitized sense signal is filtered in the digital filter 22 which may be one of any number of types of digital filters known in the art, for example low pass, band pass, high pass, or notch filters. In a similar manner, the external reference signal VREF(EXT) is converted to a digital signal in the analog-to-digital converter 26 using the internal reference voltage VREF(INT) as a reference for the conversion. The digitized reference signal is filtered in the digital filter 30 which may be one of any number of types of digital filters known in the art, for example low pass, band pass, high pass, or notch filters. The filters 22 and 30 do not have to be the same types of filters, e.g., digital filter 22 may be a band pass filter to filter noise from an AC sense signal, while the digital filter 30 could be a low pass filter to filter noise from a DC reference signal. The filtered digital sense signal and the filtered digital reference signal are combined in the digital processor circuit 24 according to a predetermined algorithm. When the ratiometric converter type of circuit 17 is used as a ratiometric converter, the predetermined algorithm of the digital processor circuit 24 is a division operation in which the filtered digitized sense signal is divided by the filtered digitized reference signal. However other types of predetermined algorithms are possible, such as multiplication (demodulation) and subtraction.

For example when the ratiometric converter type of circuit 17 provides the ratiometric converter function of the ratiometric converter 12 of FIG. 1, the output of the analog-to-digital converter 18 on line 20 can be represented as a signal $D_1$ wherein $$D_1 = \frac{x \cdot VREF(EXT)}{VREF(INT)} \tag{5}$$

Similarly, the output of the analog-to-digital converter 26 on line 28 can be represented as $D_2$ where $$D_2 = \frac{VREF(EXT)}{VREF(INT)} \tag{6}$$

The factor x in equation 5 represents the proportion of VREF which forms the sense signal and which indicates the amount of imbalance of the four resistors in the load cell 14.

These outputs are filtered in the digital filters 22 and 30. The digital filters 22 and 30 are low pass filters which operate to attenuate the electromagnetic interference and noise in the input sense signals AIN and input reference signal VREF(ext). The digital processor circuit 24 then operates to divide the filtered $D_1$ by the filtered $D_2$ to provide COUT on line 16 which is equal to x. The internal reference signal VREF(INT) need not be an accurate signal since it is canceled out in the division process.

Figure 3:
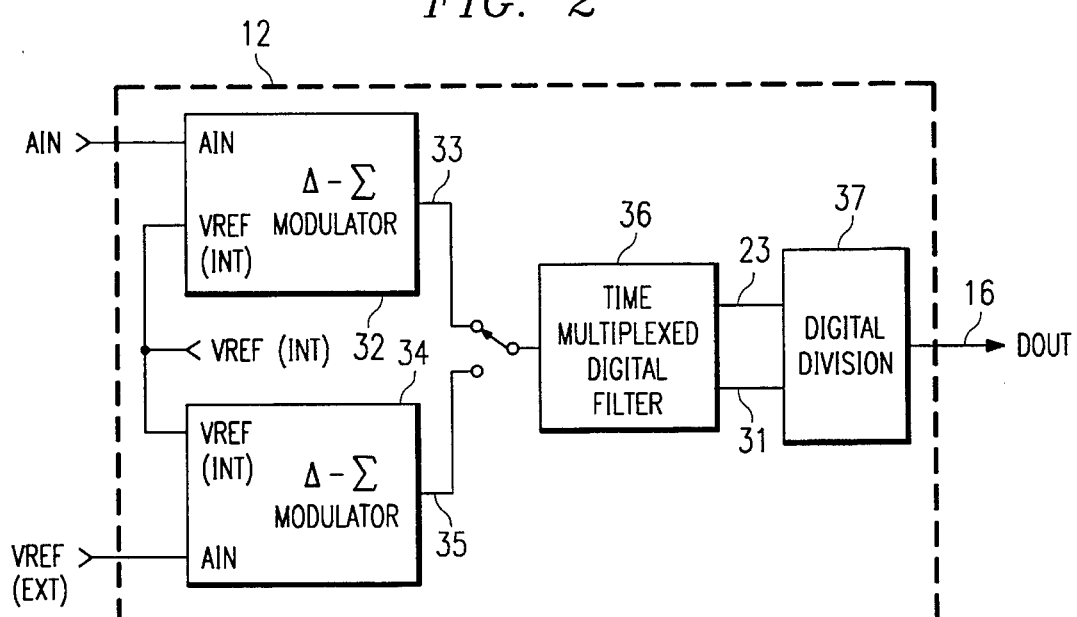
FIG. 3 is a block diagram of the preferred embodiment of a ratiometric converter type of circuit according to the present invention.
Figure 4:
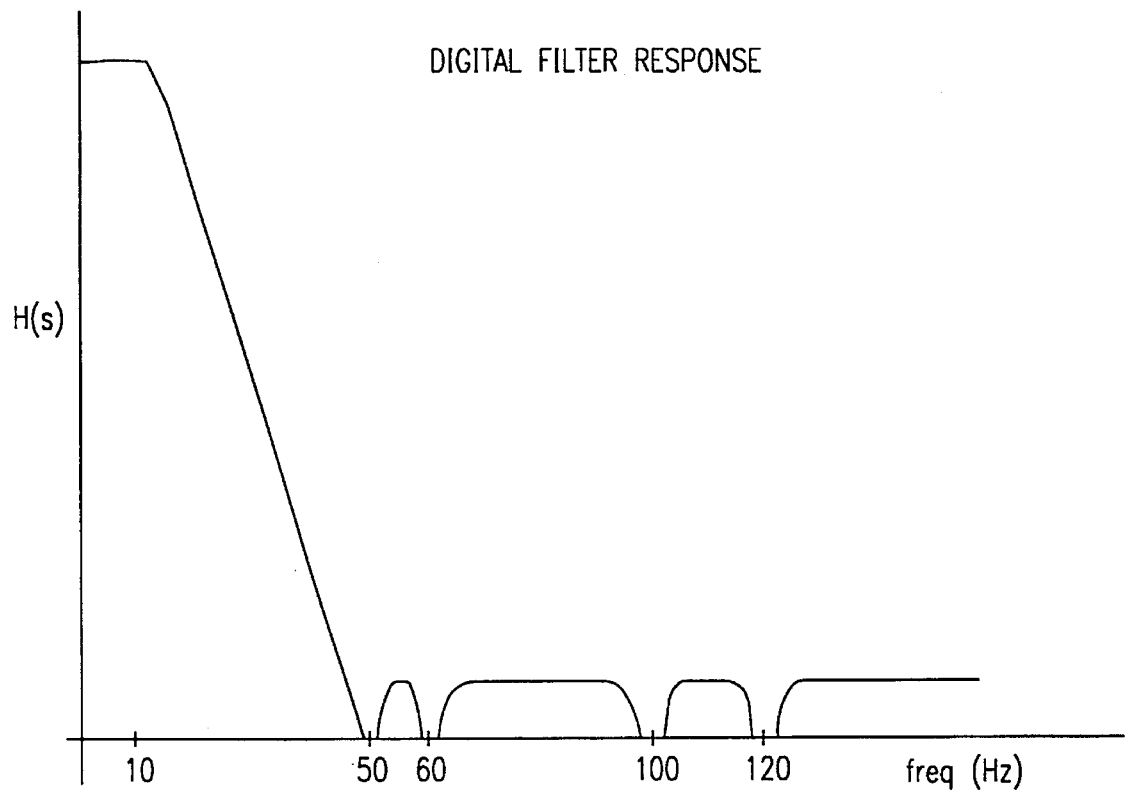
FIG. 4 is a graph of a preferred digital filter response used in conjunction with the embodiment shown in FIG. 3.

In the preferred embodiment shown in FIG. 3 of the ratiometric converter 12 of FIG. 1, the analog-to-digital converters are preferably delta-sigma modulators, and the digital filters 22 and 30 are combined into a single time multiplex digital filter. As shown in FIG. 3, a first delta-sigma modulator 32 receives AIN and VREF(INT) and provides an output on line 33. A second delta-sigma modulator 34 receives VREF(EXT) and VREF(INT) and provides an output on line 35. The outputs from the delta-sigma modulators 32 and 34 are filtered in a time multiplex digital filter 36 and the output from the time multiplex digital filters 23 and 31 are divided in the digital division circuit 37. In the preferred embodiment shown in FIG. 3, the time multiplex digital filter 36 is a time multiplex decimation filter which has characteristics shown in FIG. 4. Thus, the embodiment shown in FIG. 3 uses two delta-sigma modulators and a single time multiplex decimation filter in which the decimation filter also provides the low pass filter function performed by the digital filters 22 and 30 shown in FIG. 2. It will be noted that the digital filter response shown in FIG. 4 has nulls at 50 Hz and 60 Hz and multiples thereof to thereby provide a high degree of rejection of AC power line signals which often appear at the input lines of ratiometric converters. The digital filters 22 and 30 will not require nulls at both 50 Hz and 60 Hz if the circuits are to be used in an environment where only 50 Hz or 60 Hz would cause any measurable interference. For example, if the circuit were to be used in the United States of America only, nulls at 60 Hz would be sufficient.

Moreover the present invention can also be used in AC systems in which the sense signal and external reference signal would be AC signals rather than DC signals. In these systems the filters 22 and 30 would be band pass filters to reject low frequency and high frequency interference, high pass filters to reject low frequency interference, or notch filters to reject a specific interference frequency. The advantage of the present invention when used with AC systems is that any interference coupled onto both the sense and reference input signals produces intermodulation errors in prior art ratiometric converters which have both AC and DC components, and by proper design of the band pass, high pass, or notch filters essentially all of the AC and DC errors can be avoided. Moreover, in systems in which the sense signal is AC and the external reference signal is DC, the sense signal filter 22 can be a band pass, high pass, or notch filter while the reference signal filter 30 would be a low pass filter. Thus the present invention allows various types of filters for the filters 22 and 30, and various combinations of filters for the filters 22 and 30.

Figure 5:
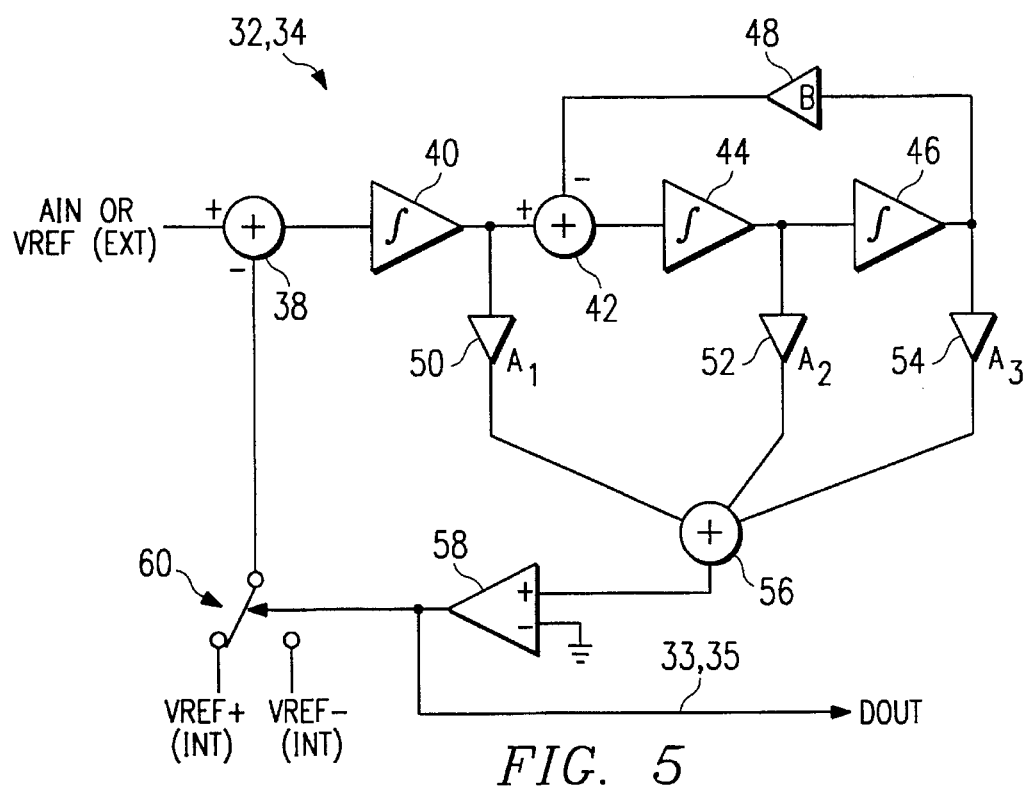
FIG. 5 is a block diagram of one of the delta-sigma modulators shown in FIG. 3.

FIG. 5 is a block diagram of the delta-sigma modulators 32 and 34 shown in FIG. 3. As shown in FIG. 5, the input signal AIN or VREF(ext) is connected to a positive input of an adder 38. The output of the adder 38 is connected to the input of a first integrator stage 40, the output of which is connected to the positive input of a second adder 42. The output of the adder 42 is connected to the input of a second integrator 44, the output of which is connected to the input of a third integrator 46. The output of the integrator 46 is coupled to the input of a feedback element 48 shown as B. The output of the feedback element 48 is connected to the negative input of the adder 42. The output of the integrator 40 is connected to the input of a feedforward element 50, shown as $A_1$. The output of the integrator 44 is connected to the input of a second feedforward element 52 shown as $A_2$. The output of the integrator 46 is connected to the input of a third feedforward element 54 shown as $A_3$. The outputs from the three feed forward elements 50, 51, and 52 are added together at an adder 56 and the output of the adder 56 is connected to the positive input of a comparator 58. The negative input at the comparator 58 is shown connected to ground for purposes of this block diagram representation of the preferred embodiment. The output of the comparator 58 forms the output signal DOUT on lines 33 and 35. The output of the comparator 58 also is used to control a switch 60 which selects between VREF+(INT) and VREF−(INT) to be connected to the negative input of the adder 38.

The delta-sigma modulator 32, 34, shown in FIG. 5 is a third order modulator which operates according to the principles well known to those skilled in the delta-sigma modulators.

Figure 6A:
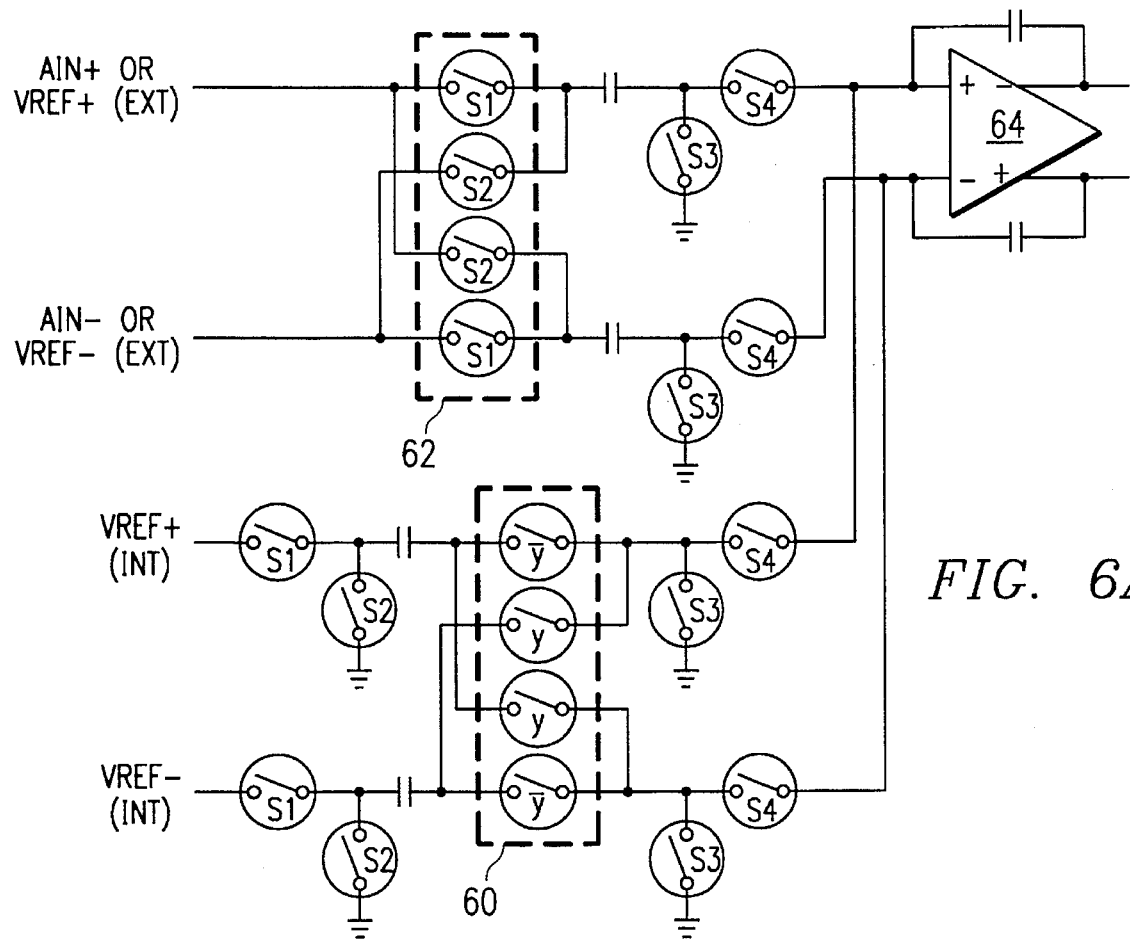
FIGS. 6A and 6B are schematic diagrams of the delta-sigma converter shown in FIG. 5.
Figure 6B:
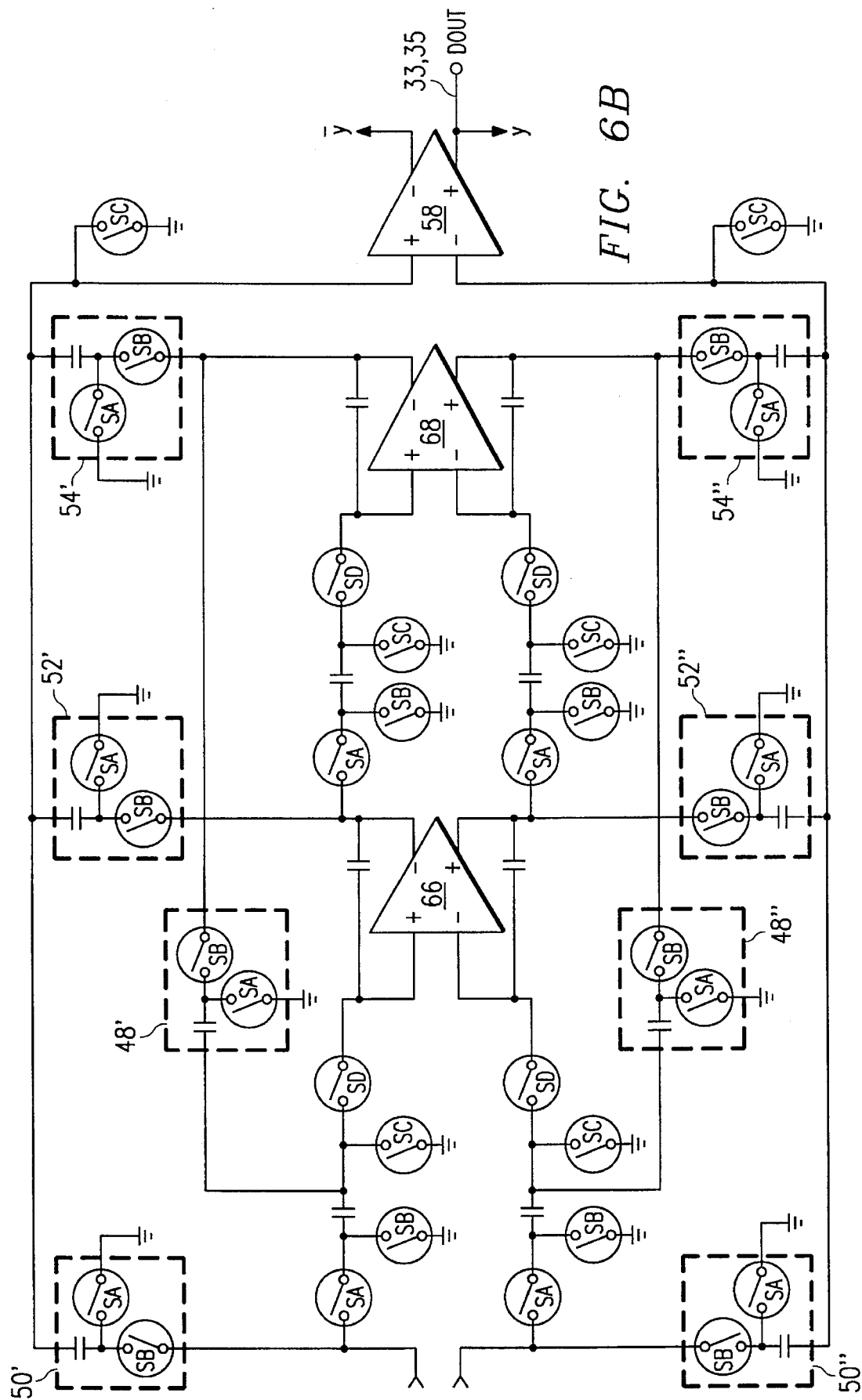

FIGS. 6A and 6B form a schematic diagram of the delta-sigma modulator 32, 34 shown in FIG. 5. As shown in FIG. 6A, the input signals AIN+ and AIN− or VREF+(ext) and VREF−(ext) are cross coupled before the first capacitor elements to improve the common node rejection of the circuit. These are cross coupled by switches shown in block 62. The operational amplifiers 64, 66, and 68 form the active elements of the integrators 40, 44, and 46, respectively, shown in FIG. 5. The feedback element 48 in FIG. 5 is a differential feedback element in FIG. 6B, shown as elements 48' and 48". Similarly, the feed forward elements 50, 52, and 54 are shown as elements 50' and 50", 52' and 52", and 54" and 54" respectively in FIG. 6b.

It will be understood that in the preferred embodiment an instrumentation amplifier (not shown) preamplifies the sense lines from the load cell 14 and the amplified sense lines are connected to the sense inputs of the ratiometric converter 12. Also the instrumentation amplifier and the operational amplifier 64 are chopper stabilized in order to improve their noise rejection, but such chopper stabilization is not necessary to carry out the present invention. Also in the preferred embodiment, the VREF+ and VREF− signals into the load cell 14 are chopped to provide additional noise immunity for the ratiometric system shown in FIG. 1.

FIG. 7 is a timing diagram of the switches shown in FIG. 6A and 6B. The arrows indicate the sequence of switching at the phase boundaries of the signals S1–S4 and SA–SD. The signal FC is the chopping signal used to chop, or switch, the inputs and outputs of the operational amplifier 64, and the instrumentation amplifier (not shown). In the preferred embodiment the load cell 14 is chopped in synchronization with the operational amplifier 64, but at a much lower frequency. However such chopping of the load cell 14 is not necessary to carry out the present invention. The chopped external sense and reference signal from the load cell 14 is demodulated by the switch bank 62 in the delta-sigma modulator 34 shown in FIG. 3.

It will be appreciated that the integrator 40 is a discrete time integrator in which the operational amplifier 64 is chopped at the sampling frequency. This ability to chop at the sample rate in a discrete time circuit arises from the timing signals S1–S4 which double sample the input signal at a rate which is twice the sample rate of the modulator. This circuit then takes advantage of the flicker and low frequency interference rejection of a chopper stabilized amplifier without introducing tones or requiring a continuous time integrator to precede the discrete time integrator.

In the preferred embodiment the ratiometric converter (including the instrumentation amplifier) is fabricated on a single integrated circuit chip.

Figure 8:
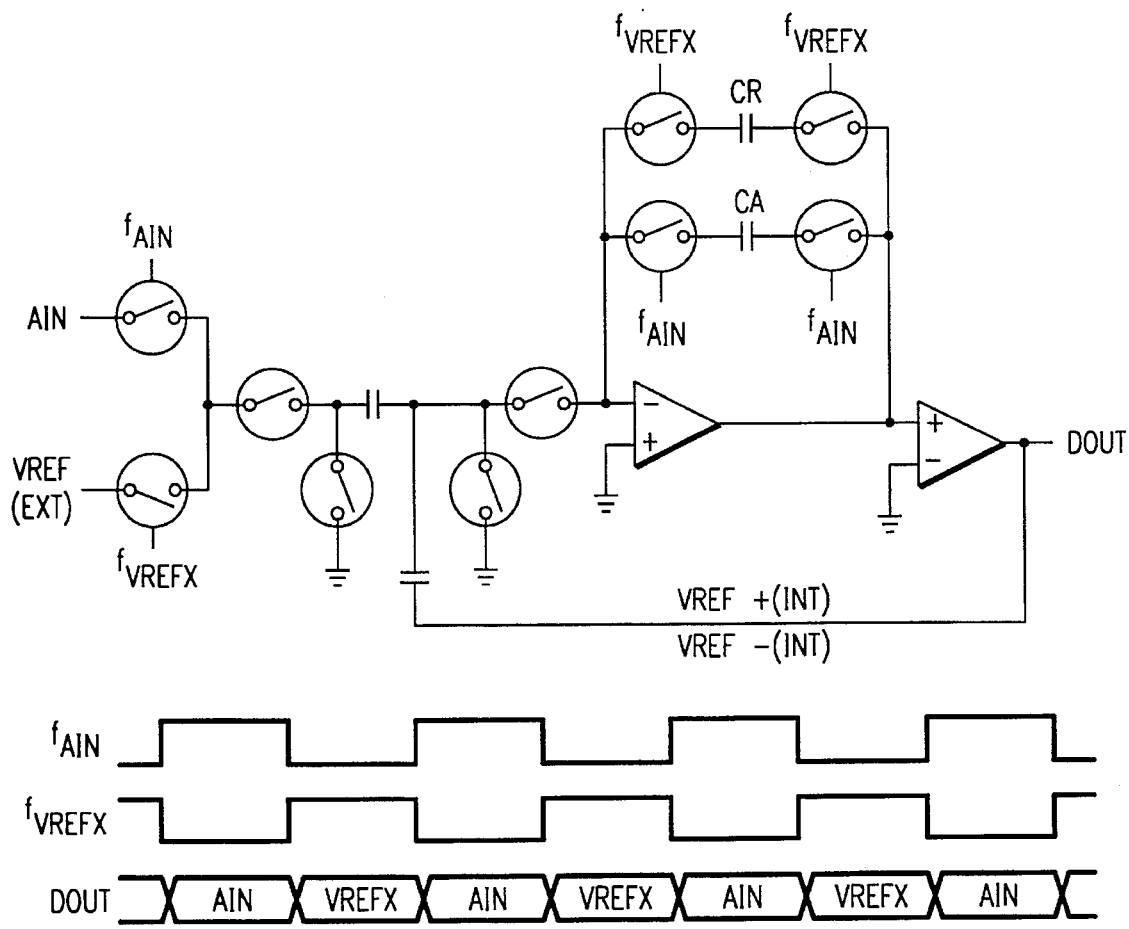
FIG. 8 is a block diagram of an alternative embodiment of the delta-sigma modulators shown in FIG. 3.

FIG. 8 is an alternative embodiment of the delta-sigma converters 32 and 34 of FIG. 3. As shown in FIG. 8 the two delta-sigma modulators have been time multiplexed to reduce the number of components in the integrated circuit containing the ratiometric converter. Alternate samples of the modulator's state variables for AIN and VREF(EXT) are stored on the capacitors labeled CA and CR respectively.

Although the block diagram shown in FIG. 8 is a first order delta-sigma modulator, higher order delta-sigma modulators can also be time multiplexed.

Figure 9:
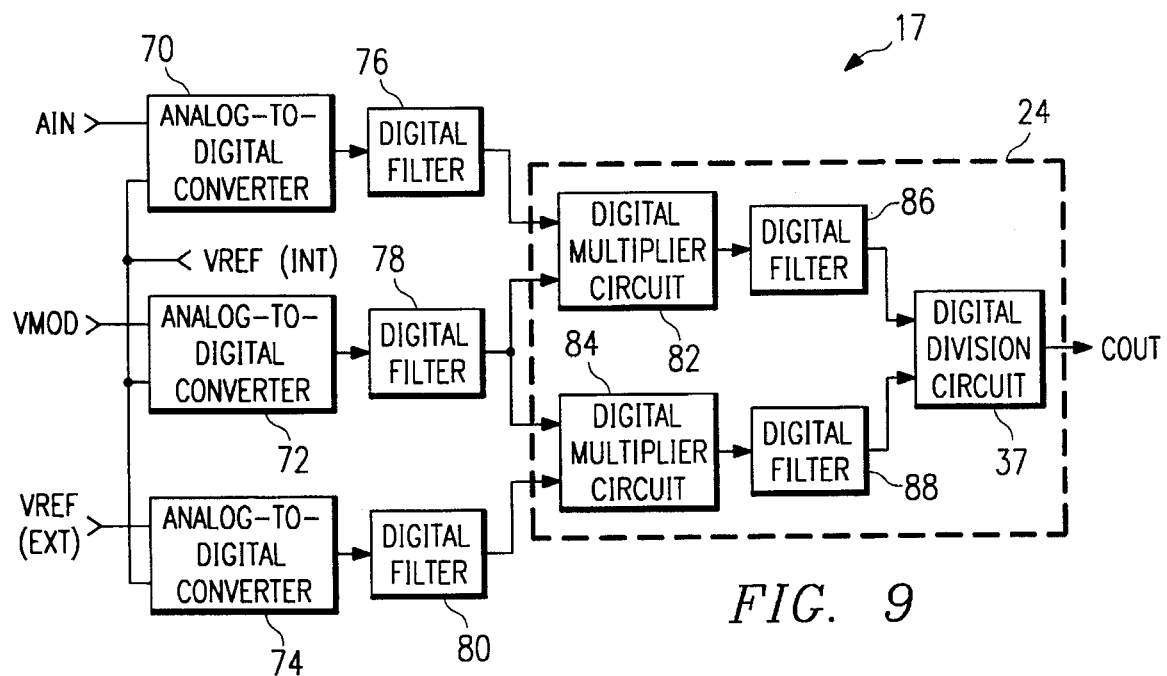
FIG. 9 is a block diagram an alternative embodiment of a ratiometric converter type of circuit according to the present invention.

FIG. 9 is a block diagram an alternative embodiment of a ratiometric converter type of circuit according to the present invention. The ratiometric type of circuit 17 has a sense input AIN and a reference input VREF(EXT), and a third input VMOD. In this embodiment the sense input AIN and the reference input VREF(EXT) come from the load cell 14 of FIG. 1. The third input VMOD is the signal used to modulate or chop the reference voltage VREF+ and VREF– in FIG. 1. This third signal VMOD can be considered to be a second sense signal or a second reference signal.

As shown in FIG. 9 the AIN signal is connected to one input of a first analog-to-digital converter 70, the other input of the analog-to-digital converter 70 connected to an internal reference signal VREF(INT). The VMOD signal is connected to one input of a second analog-to-digital converter 72, the other input of which is connected to the internal reference signal VREF(INT). The VREF(EXT) signal is connected to one input of a third analog-to-digital converter 74, the other input of which is connected to the internal reference signal VREF(INT). The outputs of the three analog-to-digital converters 70, 72, and 74 are each connected to the inputs of three digital filters 76, 78, an 80 respectively. The outputs of the three digital filters are connected to the input of a digital processor circuit 24. More specifically, the outputs of the digital filters 76 and 78 are multiplied together in a digital multiplier circuit 82. Also the outputs of the digital filters 78 and 80 are multiplied together in a digital multiplier circuit 84. The outputs of the digital multiplier circuits 82 and 84 are connected to the inputs of digital filters 86 and 88 respectively. The outputs of the digital filters 86 and 88 are digitally processed in the digital division circuit 37 to provide the output COUT from the digital division circuit 37 which is the output of the ratiometric converter type of circuit 17.

In the preferred embodiment of the invention, the demodulation of the chopped sense signal AIN and the chopped reference signal VREF(EXT) is preformed in an analog manner by reversing certain switches in synchronization with modulation or chopping of the reference voltage applied to the load cell 14. In the embodiment of FIG. 9 this demodulation is preformed digitally. That is the VMOD signal is digitized and bandpass filtered in the analog-to-digital converter 72 and digital filter 78 respectively. In a similar manner the AIN input and the VREF(EXT) inputs are converted to digital signals and bandpass filtered in the analog-to-digital converters 70 and 74, and the digital filters 76 and 80, respectively. The outputs from the digital filters 76 and 78 are multiplied together or demodulated in the digital multiplier circuit 82 to provide a DC voltage into the digital filter 86. Similarly, the outputs from the digital filters 78 and 80 are multiplied together or demodulated in the digital multiplier circuit 84 to provide a DC voltage into the digital filter 88. The digital filters 86 and 88 are low pass filters to remove noise and upper frequency cross modulation signals. The output of the digital filter 86 is divided by the output of the digital filter 88 in the digital division circuit 37 to provide the DC output signal COUT.

While the circuit of FIG. 9 requires a third analog-to-digital conversion, which could be performed by a separate converter or as part of a multiplexed converter, this circuit has the advantage of demodulating any type of VMOD signal whether it is a chopped signal or a sinusoidal signal.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example the present invention can be used with other types of analog-to-digital converters such as successive approximation converters, flash converters, and dual slope converters.

What is claimed is:

1. A method for converting a sense signal and a reference signal from a remote transducer to an output signal, said output signal being proportional to said sense signal and inversely proportional to said reference signal, such conversion method comprising the steps of:

(a) converting said sense signal from said remote transducer to a digital sense signal using a conversion reference signal such that said digital sense signal is inversely proportional to the amplitude of said conversion reference signal, said conversion reference signal being independent of both of said sense signal and said reference signal;

(b) converting said reference signal from said remote transducer to a digital reference signal using said conversion reference signal;

(c) filtering said digital sense signal to provide a filtered digital sense signal;

(d) filtering said digital reference signal to provide a filtered digital reference signal; and (e) dividing said filtered digital sense signal by said filtered digital reference signal to provide said output signal.

2. The method set forth in claim 1 wherein said steps of converting said sense signal to a digital sense signal and of converting said reference signal to a digital reference signal is through the process of delta-sigma modulation of said sense signal and said reference signal, respectively.

3. A converter which receives an input sense signal and an input reference signal from a remote transducer and which provides an output signal proportional to said input sense signal and inversely proportional to said input reference signal, said converter comprising;

(a) a first analog-to-digital converter which receives said input sense signal from said remote transducer and converts said input sense signal to a digital sense signal using a conversion reference signal such that said digital sense signal is inversely proportional to the amplitude of said conversion reference signal, said conversion reference signal being independent of both of said sense signal and said reference signal;

(b) a second analog-to-digital converter which receives said input reference signal from said remote transducer and converts said input reference signal to a digital reference signal using said conversion reference signal;

(c) a first digital filter coupled to said first analog-to-digital converter which filters said digital sense signal to provide a filtered digital sense signal;

(d) a second digital filter which filters said digital reference signal to provide a filtered digital reference signal; and (e) a divider circuit coupled to said first and second digital filters which divides said filtered digital sense signal by said filtered digital reference signal to provide said output signal.

4. The converter set forth in claim 3 wherein said first and second analog-to-digital converters are delta-sigma modulators.

5. A converter which receives an input sense signal and an input reference signal from a remote transducer and which provides an output signal proportional to said input sense signal and inversely proportional to said input reference signal, said converter comprising;

(a) a time multiplexed analog-to-digital converter which receives said input sense signal from said remote transducer and converts said input sense signal to a digital sense signal using a conversion reference signal such that said digital sense signal is inversely proportional to the amplitude of said conversion reference signal, said conversion reference signal being independent of both of said sense signal and said reference signal, and which receives said input reference signal from said remote transducer and converts said input reference signal to a digital reference signal using said conversion reference signal;

(b) a time multiplexed digital filter coupled to said time multiplexed analog-to-digital converter which filters said digital sense signal to provide a filtered digital sense signal, and which filters said digital reference signal to provide a filtered digital reference signal; and (c) a divider circuit coupled to said time multiplexed digital filter which divides said filtered digital sense signal by said filtered digital reference signal to provide said output signal.

6. A converter which receives an input sense signal and an input reference signal from a remote transducer and which provides an output signal proportional to said input sense signal and inversely proportional to said input reference signal, said converter comprising;

(a) a first analog-to-digital converter which receives said input sense signal from said remote transducer and converts said input sense signal to a digital sense signal using a conversion reference signal such that said digital sense signal is inversely proportional to the amplitude of said conversion reference signal, said conversion reference signal being independent of both of said sense signal and said reference signal;

(b) a second analog-to-digital converter which receives said input reference signal from said remote transducer and converts said input reference signal to a digital reference signal using said conversion reference signal;

(c) a time multiplexed digital filter coupled to said first and second analog-to-digital converters which filters said digital sense signal to provide a filtered digital sense signal, and which filters said digital reference signal to provide a filtered digital reference signal; and (d) a divider circuit coupled to said time multiplexed digital filter which divides said filtered digital sense signal by said filtered digital reference signal to provide said output signal.

7. A method for converting two output signals from a remote transducer of a ratiometric measurement system to a single output signal, said ratiometric measurement system having said two output signals from said remote transducer of a sense signal and a reference signal, such conversion method comprising the steps of:

(a) converting said sense signal from said remote transducer to a digital sense signal based on an internal reference signal such that said digital sense signal is inversely proportional to the amplitude of said conversion reference signal, said conversion reference signal being independent of both of said sense signal and said reference signal;

(b) converting said reference signal from said remote transducer to a digital reference signal based on said internal reference signal;

(c) filtering said digital sense signal through a low pass digital filter to provide a filtered digital sense signal;

(d) filtering said digital reference signal through a low pass digital filter to provide a filtered digital reference signal; and (d) dividing said filtered digital sense signal by said filtered digital reference signal to provide said single output signal which is proportional to said sense signal and inversely proportional to said reference signal.

8. A ratiometric converter for receiving an input sense signal and an input reference signal from a remote transducer of a ratiometric measurement system and for providing an output signal proportional to said input sense signal and inversely proportional to said input reference signal, said ratiometric converter comprising;

(a) a first analog-to-digital converter for receiving said input sense signal from said remote transducer and for converting said input sense signal to a digital sense signal based on an internal reference signal of said ratiometric converter such that said digital sense signal is inversely proportional to the amplitude of said conversion reference signal, said conversion reference signal being independent of both of said sense signal and said reference signal;

(b) a second analog-to-digital converter for receiving said input reference signal from said remote transducer and for converting said input reference signal to a digital reference signal based on said internal reference signal of said ratiometric converter;

(c) a first low pass digital filter coupled to said first analog-to-digital converter for filtering said digital sense signal to provide a filtered digital sense signal;

(d) a second low pass digital filter coupled to said second analog-to-digital converter for filtering said digital reference signal to provide a filtered digital reference signal; and (e) a divider circuit coupled to said first and second digital filters for dividing said filtered digital sense signal by said filtered digital reference signal to provide said output signal.

9. A method for converting a sense signal and a reference signal from a remote transducer to an output signal, said output signal being proportional to the magnitude of said sense signal within a predetermined frequency range and inversely proportional to the magnitude of said reference signal within said predetermined frequency range, such conversion method comprising the steps of:

(a) converting said sense signal from said remote transducer to a digital sense signal using a conversion reference signal such that said digital sense signal is inversely proportional to the amplitude of said conversion reference signal, said conversion reference signal being independent of both of said sense signal and said reference signal;

(b) converting said reference signal from said remote transducer to a digital reference signal using said conversion reference signal;

(c) filtering said digital sense signal to provide a filtered digital sense signal;

(d) filtering said digital reference signal to provide a filtered digital reference signal; and (e) dividing said filtered digital sense signal by said filtered digital reference signal to provide said output signal.

10. The method set forth in claim 9 further including the step of generating said conversion reference signal inside an integrated circuit chip embodying the circuitry for providing the conversions, the accuracy of said conversion reference signal being less than the accuracy of said output signal.

11. A converter which receives an input sense signal and an input reference signal from a remote transducer and which provides an output signal proportional to the magnitude of said input sense signal within a predetermined frequency range and inversely proportional to the magnitude of said input reference signal within said predetermined frequency range, said converter comprising;

(a) a first analog-to-digital converter which receives said input sense signal from said remote transducer and converts said input sense signal to a digital sense signal using a conversion reference signal such that said digital sense signal is inversely proportional to the amplitude of said conversion reference signal, said conversion reference signal being independent of both of said sense signal and said reference signal;

(b) a second analog-to-digital converter which receives said input reference signal from said remote transducer and converts said input reference signal to a digital reference signal using said conversion reference signal;

(c) a first digital filter coupled to said first analog-to-digital converter which filters said digital sense signal to provide a filtered digital sense signal;

(d) a second digital filter which filters said digital reference signal to provide a filtered digital reference signal; and (e) a divider circuit coupled to said first and second digital filters which divides said filtered digital sense signal by said filtered digital reference signal to provide said output signal.

12. The converter set forth in claim 11 wherein said conversion reference signal is generated on an integrated circuit which embodies said first and second analog-to-digital converters.

13. The converter set forth in claim 11 wherein said conversion reference signal is less accurate than said output signal.

14. The converter set forth in claim 11 wherein said predetermined frequency range is approximately zero frequency.

15. A method for converting a sense signal and a reference signal from a ratiometric DC measurement system to an output signal, said output signal being proportional to said sense signal and inversely proportional to said reference signal, such conversion method comprising the steps of:

(a) converting said sense signal from said ratiometric DC measurement system to a digital sense signal using a conversion reference signal such that said digital sense signal is inversely proportional to the amplitude of said conversion reference signal, said conversion reference signal being independent of both of said sense signal and said reference signal;

(b) converting said reference signal from said ratiometric DC measurement system to a digital reference signal using said conversion reference signal;

(c) filtering said digital sense signal to provide a filtered digital sense signal;

(d) filtering said digital reference signal to provide a filtered digital reference signal; and (e) dividing said filtered digital sense signal by said filtered digital reference signal to provide said output signal.

16. A method for converting a sense signal and a reference signal from a transducer to an output signal, said output signal being proportional to said sense signal and inversely proportional to said reference signal, such conversion method comprising the steps of:

(a) converting said sense signal from said transducer to a digital sense signal using a conversion reference signal such that said digital sense signal is inversely proportional to the amplitude of said conversion reference signal, said conversion reference signal being independent of both of said sense signal and said reference signal;

(b) converting said reference signal from said transducer to a digital reference signal using said conversion reference signal;

(c) filtering said digital sense signal to provide a filtered digital sense signal;

(d) filtering said digital reference signal to provide a filtered digital reference signal; and (e) dividing said filtered digital sense signal by said filtered digital reference signal to provide said output signal.

17. A method for converting a sense signal and a reference signal to an output signal, said output signal being proportional to said sense signal and inversely proportional to said reference signal, such conversion method comprising the steps of:

(a) converting said sense signal to a digital sense signal using a conversion reference signal such that said digital sense signal is inversely proportional to the amplitude of said conversion reference signal, said amplitude of said conversion reference signal being independent of both of said sense signal and said reference signal and having a range of variation due to factors other than said input sense and reference signals which is greater than the range of variation due to factors other than said input sense and reference signals of the amplitude represented by said output signal;

(b) converting said reference signal to a digital reference signal using said conversion reference signal;

(c) filtering said digital sense signal to provide a filtered digital sense signal;

(d) filtering said digital reference signal to provide a filtered digital reference signal; and (e) dividing said filtered digital sense signal by said filtered digital reference signal to provide said output signal.

* * * * *